(12) United States Patent
Hwang et al.

(10) Patent No.: US 12,707,193 B2
(45) Date of Patent: Aug. 11, 2026

(54) PORTABLE DISPLAY DEVICE

(71) Applicant: LG ELECTRONICS INC., Seoul (KR)

(72) Inventors: Sungphil Hwang, Seoul (KR); Hyunseung Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 135 days.

(21) Appl. No.: 18/716,500

(22) PCT Filed: Jul. 21, 2022

(86) PCT No.: PCT/KR2022/010678
§ 371 (c)(1),
(2) Date: Jun. 4, 2024

(87) PCT Pub. No.: WO2024/019192
PCT Pub. Date: Jan. 25, 2024

(65) Prior Publication Data
US 2025/0048024 A1 Feb. 6, 2025

(51) Int. Cl.
*H04R 1/34* (2006.01)
*H04N 21/414* (2011.01)
(Continued)

(52) U.S. Cl.
CPC ....... *H04R 1/345* (2013.01); *H04N 21/41407* (2013.01); *H04R 1/028* (2013.01);
(Continued)

(58) Field of Classification Search
CPC .... G06F 1/1605; G06F 1/1628; G06F 1/1688; H04N 5/642; H04R 1/02; H04R 1/028;
(Continued)

(56) References Cited

U.S. PATENT DOCUMENTS

2006/0100004 A1 5/2006 Kim et al.
2009/0080681 A1* 3/2009 Hamada ............... H04R 31/006 381/333
(Continued)

FOREIGN PATENT DOCUMENTS

CN 210776698 6/2020
CN 212391900 1/2021
(Continued)

OTHER PUBLICATIONS

Korean Intellectual Property Office Application No. 10-2023-7044252, Office Action dated Sep. 13, 2024, 5 pages.
(Continued)

*Primary Examiner* — Kile O Blair
(74) *Attorney, Agent, or Firm* — LEE, HONG, DEGERMAN, KANG & WAIMEY

(57) ABSTRACT

This display device comprises: a case comprising a first case and a second case coupled so as to form an inner space; a display module positioned inside the case; a link positioned between the first case and the back surface of the display module so as to vary the position of the display module through an angle change; and an audio output unit positioned on the second case. The audio output unit comprises: a sound housing having a first surface coupled to the second case; a speaker positioned on the second surface of the sound housing; and a sound guide formed on the second surface of the sound housing so as to protrude in the forward direction from the speaker toward an end of the second case. Accordingly, sounds in a high-frequency band can be sufficiently delivered to a user positioned in front of the display through the sound guide.

10 Claims, 10 Drawing Sheets

(51) Int. Cl.

| | |
|---|---|
| ***H04R 1/02*** | (2006.01) |
| ***H04R 1/28*** | (2006.01) |
| ***H05K 5/02*** | (2006.01) |

(52) U.S. Cl.
CPC ......... *H04R 1/2811* (2013.01); *H05K 5/0226* (2013.01); *H04R 2499/15* (2013.01)

(58) Field of Classification Search
CPC .. H04R 1/2811; H04R 1/323; H04R 2499/11; H04R 2499/15; H04R 1/345; H04R 5/02
See application file for complete search history.

(56) References Cited

U.S. PATENT DOCUMENTS

| | | | | |
|---|---|---|---|---|
| 2011/0058112 | A1 | 3/2011 | Goetzen | |
| 2011/0092294 | A1 | 4/2011 | Mercier | |
| 2015/0256922 | A1* | 9/2015 | Shi | H04R 1/2842 381/353 |
| 2016/0180831 | A1 | 6/2016 | Boden et al. | |
| 2017/0072869 | A1* | 3/2017 | Ito | H04R 5/023 |
| 2022/0053899 | A1* | 2/2022 | Valliere | A45C 5/14 |

FOREIGN PATENT DOCUMENTS

| | | |
|---|---|---|
| JP | 08335786 | 12/1996 |
| JP | 1997224202 | 8/1997 |
| JP | 2008258757 | 10/2008 |
| KR | 2020000009058 | 5/2000 |
| KR | 1020010114183 | 12/2001 |
| KR | 200381604 | 4/2005 |
| KR | 1020130112215 | 10/2013 |
| KR | 1020150083247 | 7/2015 |
| KR | 1020200095309 | 8/2020 |
| WO | 9931649 | 6/1999 |
| WO | 0153918 | 7/2001 |

OTHER PUBLICATIONS

PCT International Application No. PCT/KR2022/010678 International Search Report dated Apr. 7, 2023, 11 pages.

Korean Intellectual Property Office Application No. 10-2023-7044252, Prior Art Search Report dated Jan. 2, 2024, 7 pages.

European Patent Office Application Serial No. 22952041.6, Search Report dated Mar. 4, 2025, 9 pages.

* cited by examiner (a)

(b)

(a)

(b)

PORTABLE DISPLAY DEVICE

CROSS-REFERENCE TO RELATED APPLICATION(S)

This application is the National Stage filing under 35 U.S.C. 371 of International Application No. PCT/KR2022/010678, filed on Jul. 21, 2022, the contents of which are all incorporated by reference herein in its entirety.

TECHNICAL FIELD

The present disclosure relates to a portable display device including a case.

BACKGROUND ART

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

Recently, materials such as OLED emit light on their own without a backlight structure on the back, so a curved display device can be implemented by implementing a curved display panel.

As outdoor activities such as camping have increased recently, there is a need for displays that can be used outside. A projector has the advantage of being small in size. Yet, the projector is difficult to carry and install a screen, and there is a limitation that it is difficult to use during the day because the contrast ratio is not high.

Recently, as the thickness of a display device decreases, the number of users who use the display device with a size of 30 inches or less in outdoor places such as camping sites is increasing.

However, a display device of such a type requires a separate bag for portability, a stand should be purchased separately for mounting, and a speaker should be installed separately, making it cumbersome to purchase and carry accessories.

Therefore, there is a need for a display device that can be carried and installed conveniently and simply and also installed at various heights without restrictions on an installation location.

DISCLOSURE

Technical Task

One technical task of the present disclosure is to provide a speaker-mounted display device having a case for facilitation of portability.

Technical Solutions

In order to solve the above-described problems, provided is a display device including a case having a first case and a second case coupled together by forming an inner space, a display module located inside the case, a link located between the first case and a rear surface of the display module to vary a position of the display module by changing an angle, and an audio output unit located in the second case, the audio output unit including a sound housing having a first surface coupled to the second case, a speaker located on a second surface of the sound housing, and a sound guide formed on the second surface of the sound housing and protruding more in a front direction toward an end portion of the second case from the speaker.

The audio output unit may be formed symmetrically on both sides of the second case in a horizontal direction and the speaker may be disposed adjacent to a horizontal end portion of the second case.

The sound guide may further include a plurality of slits.

The speaker may output sound of 1 kHz or more.

The display device may further include an elastic member attached to the second surface of the sound housing, and the elastic member may not be located between the speaker and the sound guide.

The second surface of the sound housing may have a step difference formed on a circumference of the speaker except an area having the sound guide located therein.

The audio output unit may include a resonance space formed inside the sound housing and a resonance hole formed in one side of the sound housing.

The second case may be erected on one side of the first case in a direction vertical to the first case to fix an open state, the display module may be located in a direction of the other side rather than the second case when erected on the first case in the vertical direction, and the speaker may face a rear surface of the display module.

The case may include a handle formed on one side thereof.

The display device may include a plurality of legs accommodated in the second or first case, and the first case may further include a leg fastening part on an outside thereof to be coupled to an end portion of the leg.

Advantageous Effects

According to the present disclosure, a display device may be conveniently carried without having to carry a separate stand or speaker.

In addition, the display device of the present disclosure may sufficiently transmit sound in a high frequency band to a user located in front of a display through a sound guide.

Effects obtainable from the present disclosure are not limited by the above mentioned effects, and other unmentioned effects can be clearly understood from the above description by those having ordinary skill in the technical field to which the present disclosure pertains.

BEST MODE

Figure 1:
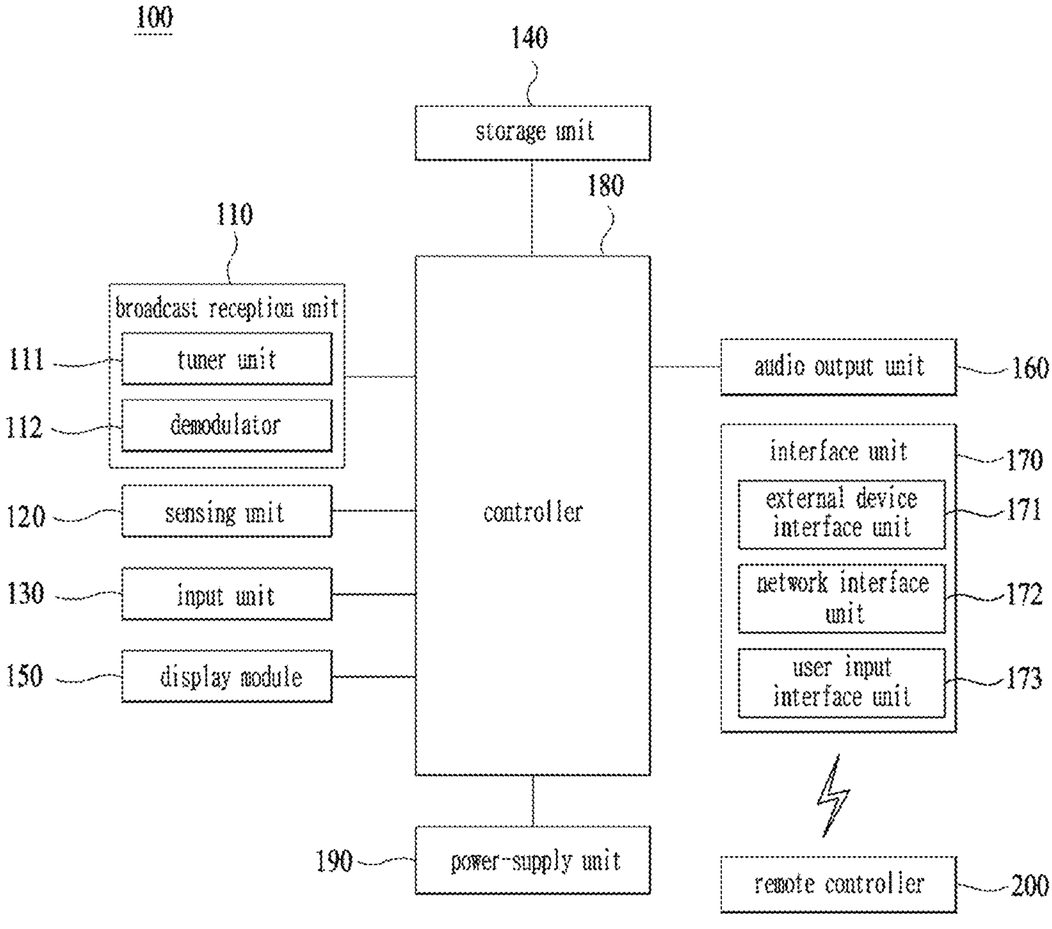
FIG. 1 is a block diagram illustrating each configuration of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device described in this specification is, for example, an intelligent image display device having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100. The display device 100 may include a broadcast reception unit 110, an external device interface unit 171, a network interface unit 172, a storage unit 140, a user input interface unit 173, an input unit 130, a controller 180, a display module 150, an audio output unit 160, and/or a power supply unit 190.

The broadcast reception unit 110 may include a tuner unit 111 and a demodulation unit 112.

Unlike the figure, on the other hand, the display device 100 may include only the external device interface unit 171 and the network interface unit 172, among the broadcast reception unit 110, the external device interface unit 171, and the network interface unit 172. That is, the display device 100 may not include the broadcast reception unit 110.

The tuner unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

For example, when the selected broadcast signal is a digital broadcast signal, the tuner unit 111 may convert the broadcast signal into a digital IF (DIF) signal, and when the selected broadcast signal is an analog broadcast signal, the tuner unit 111 may convert the broadcast signal into an analog baseband video or audio (CVBS/SIF) signal. That is, the tuner unit 111 may process the digital broadcast signal or the analog broadcast signal. The analog baseband video or audio (CVBS/SIF) signal output from the tuner unit 111 may be directly input to the controller 180.

Meanwhile, the tuner unit 111 may sequentially select broadcast signals of all broadcast channels stored through a channel memory function, among received broadcast signals, and may convert each of the selected broadcast signals into an intermediate frequency signal or a baseband video or audio signal.

Meanwhile, the tuner unit 111 may include a plurality of tuners in order to receive broadcast signals of a plurality of channels. Alternatively, a single tuner may simultaneously receive broadcast signals of a plurality of channels.

The demodulation unit 112 may receive the digital IF (DIF) signal converted by the tuner unit 111, and may perform demodulation. After performing demodulation and channel decryption, the demodulation unit 112 may output a stream signal (TS). At this time, the stream signal may be a multiplexed image, audio, or data signal.

The stream signal output from the demodulation unit 112 may be input to the controller 180. After performing demultiplexing and image/audio signal processing, the controller 180 may output an image through the display module 150, and may output audio through the audio output unit 160.

The sensing unit 120 is a device configured to sense change inside or outside the display device 100. For example, the sensing unit 120 may include at least one of a proximity sensor, an illumination sensor, a touch sensor, an infrared (IR) sensor, an ultrasonic sensor, an optical sensor (e.g. a camera), an audio sensor (e.g. a microphone), a battery gauge, and an environmental sensor (e.g. a hygrometer or a thermometer).

The controller 180 may check the state of the display device 100 based on information collected by the sensing unit, and when a problem occurs, may inform a user of the same or may solve the problem, whereby the controller may perform control such that the display device is maintained in the best state.

In addition, the controller may differently control the content, quality, and size of an image provided to the display module 150 based on a viewer or ambient light sensed by the sensing unit in order to provide the optimum viewing environment. With progress of a smart TV, a large number of functions have been loaded in the display device, and the sensing unit 20 has also been increased in number.

The input unit 130 may be provided at one side of a main body of the display device 100. For example, the input unit 130 may include a touchpad or a physical button. The input unit 130 may receive various user commands related to the operation of the display device 100, and may transmit control signals corresponding to the received commands to the controller 180.

With a decrease in size of a bezel of the display device 100, many display devices 100 have been configured such that the number of physical button type input units 130 exposed to the outside is minimized in recent years. Instead, a minimum number of physical buttons is located at the rear surface or the side surface of the display device, and the display device may receive user input through the touchpad or the user input interface unit 173, a description of which will follow, using a remote controller 200.

The storage unit 140 may store programs for signal processing and control in the controller 180, and may store a processed image, audio, or data signal. For example, the storage unit 140 may store application programs designed to execute various tasks that can be processed by the controller 180, and may selectively provide some of the stored application programs in response to request of the controller 180.

Programs stored in the storage unit 140 are not particularly restricted as long as the programs can be executed by the controller 180. The storage unit 140 may temporarily store an image, audio, or data signal received from an external device through the external device interface unit 171. The storage unit 140 may store information about a predetermined broadcast channel through a channel memory function, such as a channel map.

FIG. 1 shows an embodiment in which the storage unit 140 and the controller 180 are separately provided; however, the present disclosure is not limited thereto. The storage unit 140 may be included in the controller 180.

The storage unit 140 may include at least one of a volatile memory (e.g. DRAM, SRAM, or SDRAM), a nonvolatile memory (e.g. flash memory), a hard disk drive (HDD), and a solid-state drive (SSD).

The display module 150 may convert an image signal, a data signal, an OSD signal, and a control signal processed by the controller 180 or an image signal, a data signal, and a control signal received from the interface unit 171 to generate a driving signal. The display module 150 may include a display panel 181 having a plurality of pixels.

Each of the plurality of pixels in the display panel may include RGB subpixels. Alternatively, each of the plurality of pixels in the display panel may include RGBW subpixels. The display module 150 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 150, and a 3D display may also be used. The 3D display 130 may be classified as a non-glasses type display or a glasses type display.

The display device includes a display module, which occupies a major portion of the front surface thereof, and a case configured to cover the rear surface and the side surface of the display module, the case being configured to package the display module.

In recent years, the display device 100 has used a flexible display module 150, such as light-emitting diodes (LED) or organic light-emitting diodes (OLED), in order to implement a curved screen.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid 2010 and has rapidly replaced the LCD in the small- or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply unit, and a first signal module located at a rear surface of the display panel. The display panel may include a plurality of pixels R, G, and B. The plurality of pixels R, G, and B may be formed at intersections between a plurality of data lines and a plurality of gate lines. The plurality of pixels R, G, and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface.

The audio output unit 160 receives an audio signal processed by the controller 180 and outputs the same as audio.

The interface unit 170 serves as a path to various kinds of external devices connected to the display device 100. The interface unit may include a wireless system using an antenna as well as a wired system configured to transmit and receive data through a cable.

The interface unit 170 may include at least one of a wired/wireless headset port, an external charger port, a wired/wireless data port, a memory card port, a port for connection with a device having an identification module, an audio input/output (I/O) port, a video input/output (I/O) port, and an earphone port.

The broadcast reception unit 110 may be included as an example of the wireless system, and a mobile communication signal, a short-range communication signal, and a wireless Internet signal as well as a broadcast signal may be included.

The external device interface unit 171 may transmit or receive data to or from a connected external device. To this end, the external device interface unit 171 may include an A/V input and output unit (not shown).

The external device interface unit 171 may be connected to an external device, such as a digital versatile disc (DVD) player, a Blu-ray player, a game console, a camera, a camcorder, a computer (laptop computer), or a set-top box, in wired/wireless manner, and may perform input/output operation for the external device.

In addition, the external device interface unit 171 may establish a communication network with various remote controllers 200 in order to receive a control signal related to the operation of the display device 100 from each remote controller 200 or to transmit data related to the operation of the display device 100 to each remote controller 200.

The external device interface unit 171 may include a wireless communication unit (not shown) for short-range wireless communication with another electronic device. The external device interface unit 171 may exchange data with a mobile terminal adjacent thereto through the wireless communication unit (not shown). Particularly, in a mirroring mode, the external device interface unit 171 may receive device information, information of an application that is executed, and an image of the application from the mobile terminal.

The network interface unit 172 may provide an interface for connection of the display device 100 with a wired/wireless network including the Internet. For example, the network interface unit 172 may receive content or data provided by an Internet or content provider or a network operator through the network. Meanwhile, the network interface unit 172 may include a communication module (not shown) for connection with the wired/wireless network.

The external device interface unit 171 and/or the network interface unit 172 may include a communication module for short-range communication, such as Wi-Fi, Bluetooth, Bluetooth Low Energy (BLE), ZigBee, or Near Field Communication (NFC), or a communication module for cellular communication, such as Long-Term Evolution (LTE), LTE Advance (LTE-A), Code Division Multiple Access (CDMA), Wideband CDMA (WCDMA), Universal Mobile Telecommunications System (UMTS), or Wireless Broadband (WiBro).

The user input interface unit 173 may transmit a user input signal to the controller 180, or may transmit a signal from the controller 180 to a user. For example, the user input interface unit may transmit/receive a user input signal, such as power on/off, channel selection, or screen setting, to/from the remote controller 200, may transmit a user input signal, such as a power key, a channel key, a volume key, or a setting value, input from a local key (not shown) to the controller 180, may transmit a user input signal input from a sensor unit (not shown) configured to sense user gesture to the controller 180, or may transmit a signal from the controller 180 to the sensor unit.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit 111, the demodulation unit 112, the external device interface unit 171, or the network interface unit 172, or may process demultiplexed signals to generate and output a signal for image or audio output.

An image signal processed by the controller 180 may be input to the display module 150, which may display an image corresponding to the image signal. In addition, the image signal processed by the controller 180 may be input to an external output device through the external device interface unit 171.

An audio signal processed by the controller 180 may be output through the audio output unit 160. In addition, the audio signal processed by the controller 180 may be input to an external output device through the external device interface unit 171. Although not shown in FIG. 2, the controller 180 may include a demultiplexing unit and an image processing unit, which will be described below with reference to FIG. 3.

Further, the controller 180 may control the overall operation of the display device 100. For example, the controller 180 may control the tuner unit 111 such that a broadcast corresponding to a channel selected by a user or a pre-stored channel is tuned.

In addition, the controller 180 may control the display device 100 according to a user command input through the user input interface unit 173 or an internal program. Meanwhile, the controller 180 may control the display module 150 to display an image. At this time, the image displayed on the display module 150 may be a still image or video, or may be a 2D image or a 3D image.

Meanwhile, the controller 180 may perform control such that a predetermined 2D object is displayed in an image displayed on the display module 150. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 150, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 150 corresponding to the location of the user.

The controller 180 may sense user gesture based on the image captured by the photographing unit, a signal sensed by the sensor unit, or a combination thereof.

The power supply unit 190 may supply power to the components of the display device 100. In particular, the power supply unit may supply power to the controller 180, which may be implemented in the form of a system on chip (SOC), the display module 150 for image display, and the audio output unit 160 for audio output.

Specifically, the power supply unit 190 may include an AC/DC converter (not shown) configured to convert AC power into DC power and a DC/DC converter (not shown) configured to convert the level of the DC power.

Meanwhile, the power supply unit 190 serves to distribute power supplied from the outside to the respective components of the display device. The power supply unit 190 may be directly connected to an external power supply in order to supply AC power, or may include a battery so as to be used by charging.

In the former case, a cable is used, and the power supply unit is difficult to move or the movement range of the power supply unit is limited. In the latter case, the power supply unit is free to move, but the weight of the power supply unit is increased in proportion to the weight of the battery, the volume of the power supply unit is increased, and, for charging, the power supply unit must be directly connected to a power cable or must be coupled to a charging holder (not shown) that supplies power for a predetermined time.

The charging holder may be connected to the display device through a terminal exposed to the outside, or the battery mounted in the power supply unit may be charged in a wireless manner when the power supply unit approaches the charging holder.

The remote controller 200 may transmit user input to the user input interface unit 173. To this end, the remote controller 200 may use Bluetooth communication, radio frequency (RF) communication, infrared radiation communication, ultra-wideband (UWB) communication, or ZigBee communication. In addition, the remote controller 200 may receive an image, audio, or data signal output from the user input interface unit 173 so as to be displayed thereon or audibly output therefrom.

Meanwhile, the display device 100 may be a stationary or movable digital broadcast receiver capable of receiving a digital broadcast.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
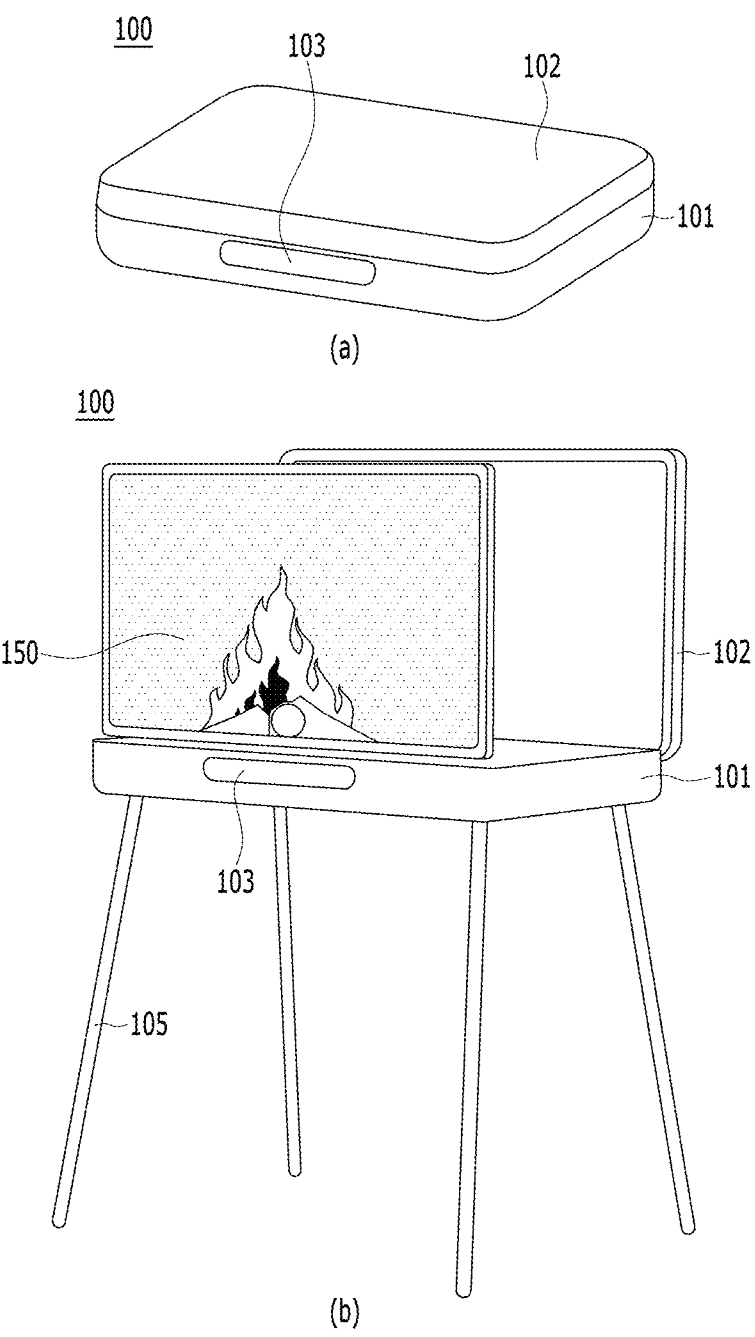
FIG. 2 is a perspective diagram illustrating an example of a display device of the present disclosure.

FIG. 2 is a front perspective diagram illustrating an example of a display device. A display device 100 of the present disclosure includes cases 101 and 102 to be portable. A display module 150 is accommodated in the cases 101 and 102 to be portable, as shown in FIG. 2 (*a*), and may be mounted as shown in FIG. 2 (*b*) in use.

The cases 101 and 102 may have a box shape like a carrier, consisting of a first case 101 forming one surface and a second case 102 forming the other surface, and may be provided with a handle 103 for portability in a closed state as shown in FIG. 2 (*a*).

Components such as the display module 150, an audio module 160, and the like may be located between the first case 101 and the second case 102.

The second case 102 is rotatably hinge-coupled to one side of the first case 101, and the second case 102 may be opened while maintaining a state perpendicular to the first case 101 as shown in FIG. 2 (*b*).

The display device 100 of the present disclosure may include the display module 150, the case 101 and 102 in which the display module 150 is accommodated, and a link 155 positioned between a rear surface of the display module 150 and the case 101 and 102 to adjust the position of the display module 150 on the case 101 and 102.

A leg 105 may be included to enable the display module 150 to be positioned at a prescribed height from a floor by being combined with one surface of the case 101 and 102. The leg 105 may be formed in a multi-stage form so as to have an adjustable length.

Figure 3:
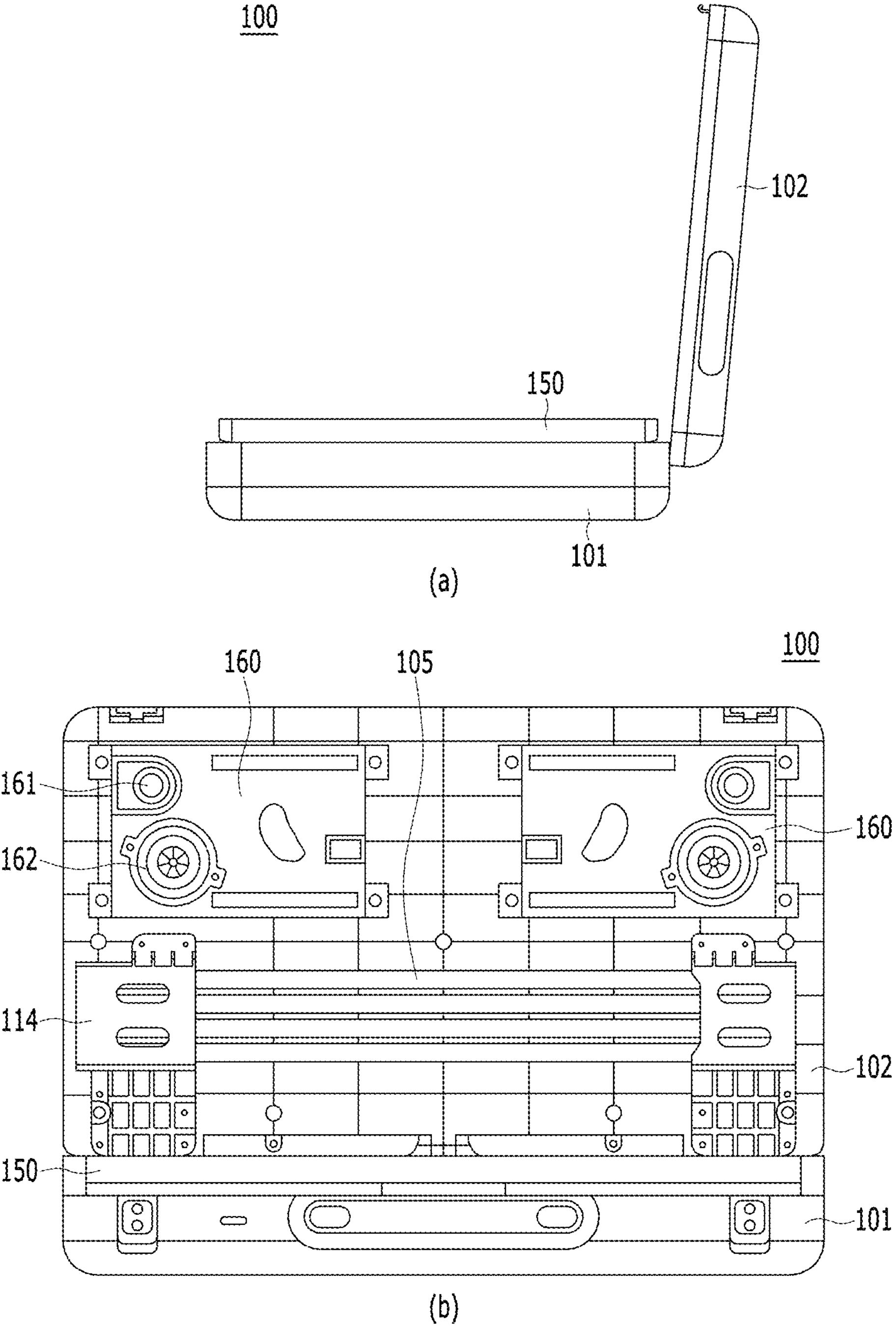
FIGS. 3 to 5 are diagrams illustrating states with respect to positions of a display of a display device of the present disclosure.

When carried, the leg 105 may be accommodated in the case 101 and 102 as shown in FIG. 3 (*b*). When used, the leg 105 may be coupled to the case 101 and 102 and mounted on the floor as shown in FIG. 2 (*b*). As shown in FIG. 2 (*a*), the display module 150 may be disposed upright in the case 101 and 102 to face the front, and the angle and position of the display module 150 may be adjusted using the link 155.

As shown in FIG. 2 (*b*), a direction in which the display module 150 faces in a state that the display device 100 is mounted is referred to as a front direction, and a direction opposite to the front direction is referred to as a rear direction. When the display module 150 is withdrawn from the first case 101 and mounted in a vertical direction to the first case 101, the second case 102 may be located in a direction of the rear surface of the display module 150.

Figure 4:
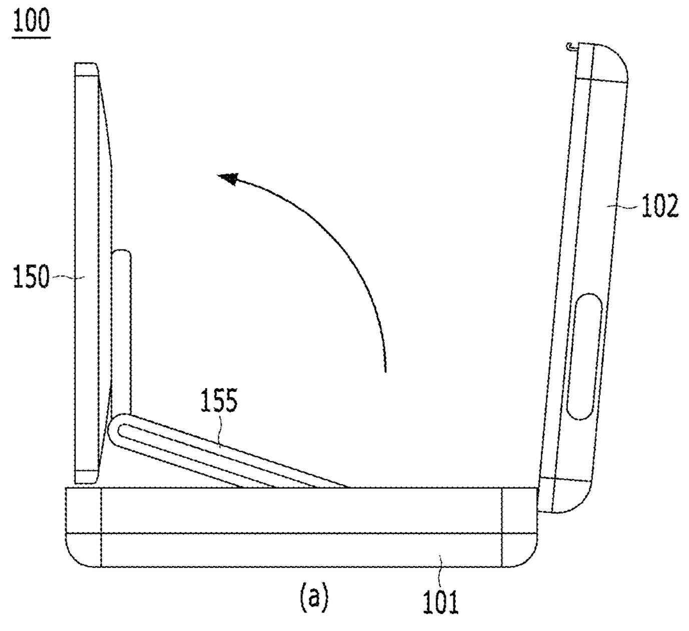
Figure 4:
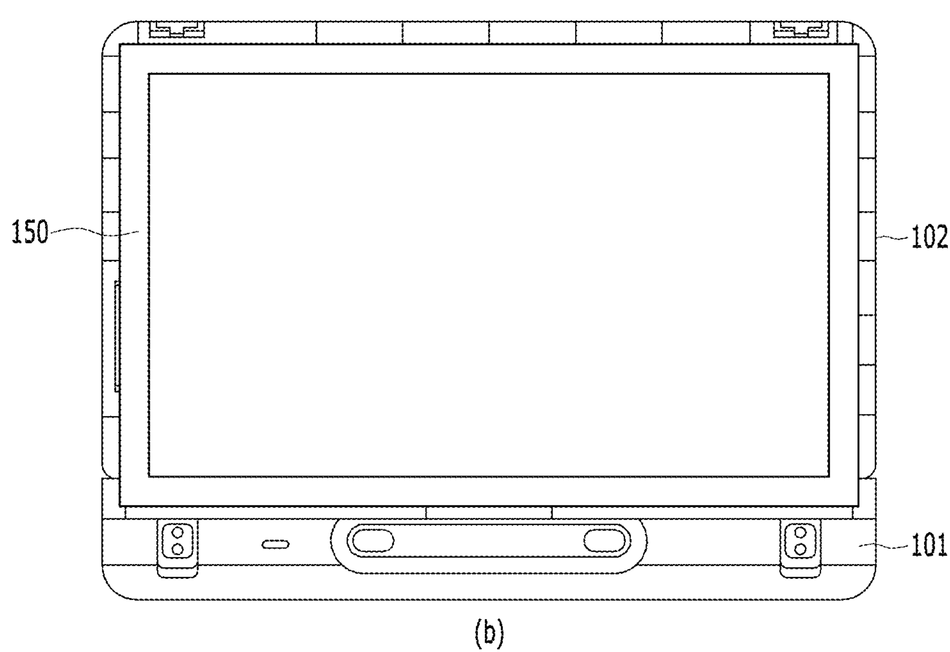
Figure 5:
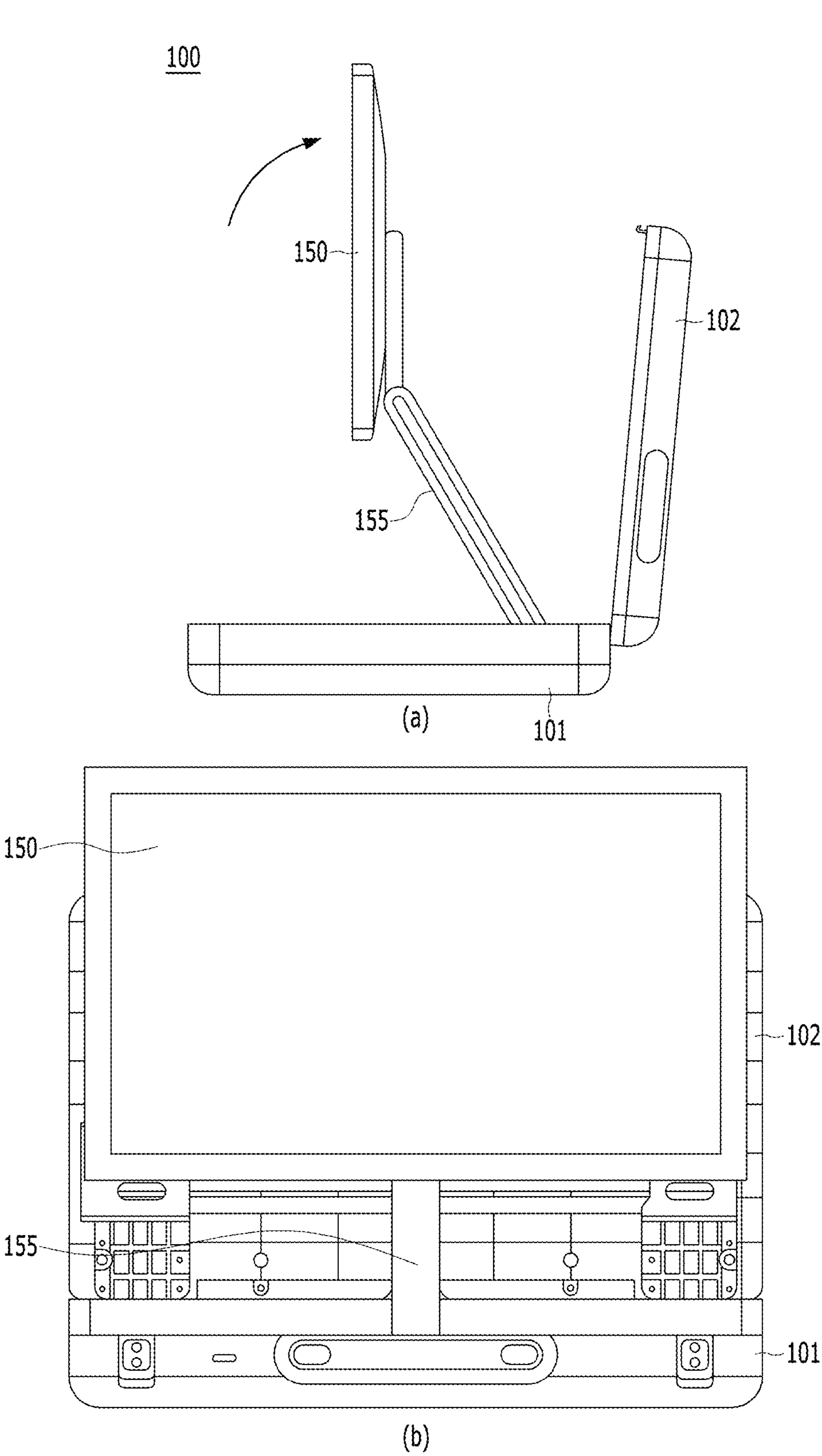

FIGS. 3 to 5 are diagrams illustrating states depending on positions of the display module 150 of the display device 100 of the present disclosure. In the drawings, (a) shows a side view and (b) shows a front view.

As shown in FIG. 3, in a closed state in which the cases 101 and 102 overlap each other as shown in FIG. 2 (*a*), the second case 102 may be rotated from one side of the first case 101 to be vertically disposed as shown in FIG. 3 (*a*).

Here, the vertical does not mean an exact 90°, but may be determined at an angle between 90° and 100° so that an inner surface of the second case 102 faces the front when the first case 101 is mounted on the floor.

In this case, the display module 150 may be located inside the first case 101 or on an upper side in the drawing while being disposed in parallel with the first case 101. As shown in FIG. 3, the display module 150 may have a shape projected slightly upward from the first case 101. When the second case 102 is formed thin, the display module 150 may be accommodated inside the first case 101.

Referring to FIG. 3 (*b*), the audio output unit 160 may be disposed inside the second case 102. A pair of the audio output units 160 may be provided to be bilaterally symmetrical to each other to provide stereo sound.

Figure 6:
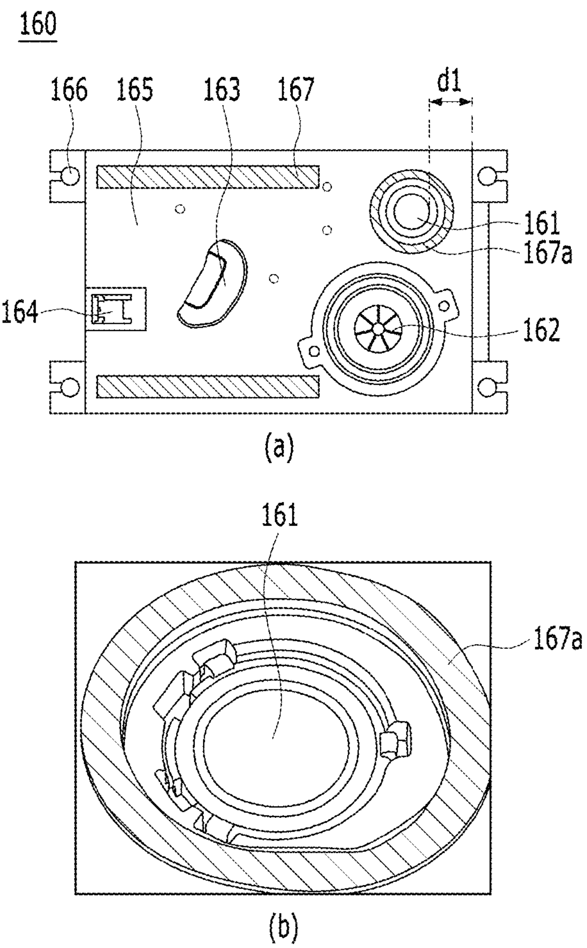
FIG. 6 is a diagram illustrating one embodiment of an audio output unit of a display device according to the present disclosure.

FIG. 6 is a diagram illustrating the audio output unit 160 of the display device 100 according to one embodiment of the present disclosure. FIG. 6 (*a*) illustrates the audio output unit 160 located on the right side in a pair of the audio output units 160.

The audio output unit 160 includes a speaker and a sound housing 165 accommodating the speaker, and a first surface of the sound housing 165 is attached to an inner surface of the second case 102, and a second surface may output sound in a user's direction toward the front when the second case 102 is open.

The speaker is located on the second surface of the sound housing 165, and the sound housing 165 may have an opening formed in the second surface so that a diaphragm of the speaker may face the second surface. The audio output unit 160 may include a plurality of speakers 161 and 162. For example, both a woofer 162 outputting the bass and a tweeter 161 outputting the treble may be provided thereto.

In order to supply power to the speakers 161 and 162 of the audio output unit 160 and transmit a sound signal, the audio output unit 160 needs to be connected to the controller 180 of the display device 100, and a connector 164 for connecting to the controller may be provided on one side of the sound housing 165.

Since it is desirable for a pair of the audio output units 160 to be disposed in a manner of being spaced apart from each other so that left and right sounds can be distinguished by stereo, as shown in FIG. 3 (*b*), the speakers 161 and 162 of the audio output unit 160 on the left may be positioned over to the left, and the speakers 161 and 162 of the audio output unit 160 on the right may be positioned over to the right.

The sound housing 165 includes a resonance space therein, and the vibration of the speaker diaphragm may be outputted by being amplified in the resonance space. A resonance hole 163 through which air may be introduced and discharged for resonance in the resonance space may be formed in the sound housing 165.

The audio output unit 160 may include an elastic part 167 capable of absorbing an impact on the second surface of the sound housing 165 to prevent the display module 150 from being damaged by an external impact because the audio output unit 160 is disposed to face the front surface of the display module 150 in a state that the cases 101 and 102 are closed.

The elastic part 167 may be disposed so as not to overlap the speakers 161 and 162 as shown in FIG. 6, and the elastic part 167*a* located around the speaker 161 may be configured to surround the speaker 161.

The leg 105 may be provided inside the second case 102. The leg 105 may be fastened to the first case 101 to mount the case 101 and 102 at a position spaced apart from the floor by a prescribed distance without a separate stand, as shown in FIG. 2 (*b*).

When carried, the leg 105 may be accommodated in a leg accommodation device 114 positioned inside the second case 102 as shown in FIG. 3 (*b*). Four legs may be provided for stable mounting, and the length of the legs 105 may be changed in multiple stages to be accommodated in the case 101 and 102.

The leg 105 may be accommodated in the first case 101, and positioned between the display module 150 and the first case 101. In this case, it is inconvenient to remove the leg 105 from the case 101 and 102 after the display module 150 has been erected as shown in FIG. 4. Yet the thickness of the second case 102 may be reduced or the size of the audio module may be formed larger.

The first case 101 may have a leg fastening part (not shown) on an outer surface thereof, and the leg fastening part may include an obliquely formed hole so that the leg 105 is fastened in an extended shape toward the outside, as shown in FIG. 2 (*b*).

The leg fastening part may be fastened using a hook mechanism, or the leg 105 may be fastened through a spiral groove. In the latter case, a length of the leg 105 may finely be adjusted by adjusting a fastening extent of the spiral.

FIG. 4 is a diagram illustrating a state in which the display module 150 is erected to be vertical to the first case 101. The second case 102 may be located on one side of the first case 101, and the display module 150 may be located on the other side of the first case 101 rather than the second case 102.

The display module 150 may be connected to the first case 101 through the link 155, and both sides of the link 155 may be rotatably coupled to freely adjust the position and angle of the display module 150.

The position of the display module 150 may be adjusted by adjusting the angle of the link 155 so that the display module 150 is disposed in the front direction of the first case 101 as shown in FIG. 4 (*a*) or disposed to be spaced apart from the first case 101 upward as shown in FIG. 5 (*a*).

In this way, in order to output an image to the display module 150 and allow a user to appreciate it, the display module 150 is located in front of the second case 102, thereby causing a problem in blocking the audio module located in the second case 102.

Figure 7:
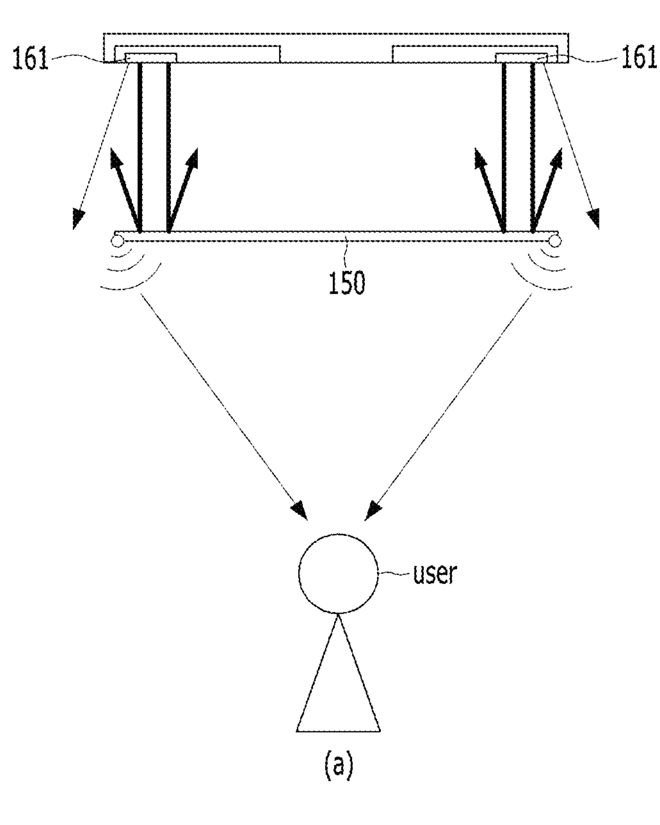
FIG. 7 is a diagram illustrating a direction of sound outputted from an audio output unit.
Figure 7:
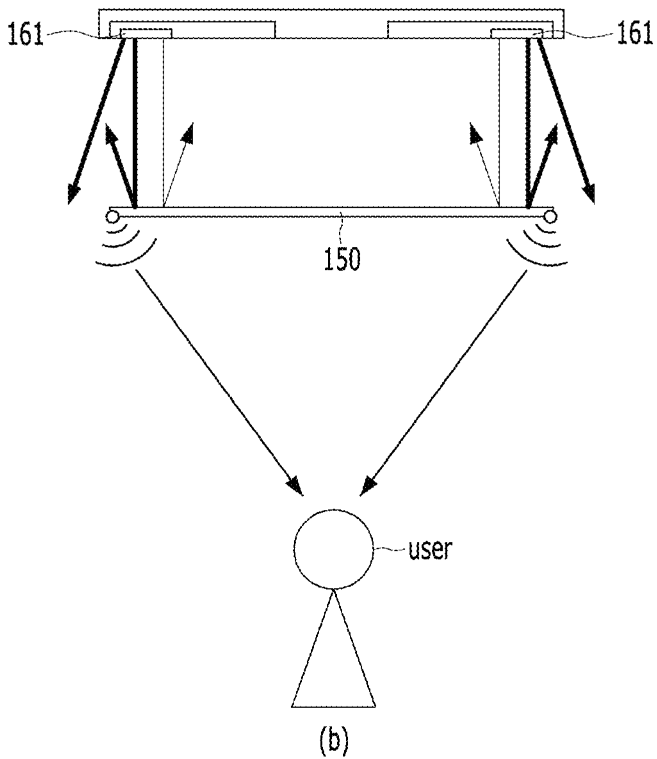

FIG. 7 is a diagram illustrating a direction of sound outputted from the tweeter 161. A low-pitched sound outputted from the woofer 162 has little directivity and thus does not significantly affect sound transmission even if the display module 150 is located in front of the woofer 162.

Yet, the sound of 1 kHz or more outputted from tweeter 161 may be reflected and not transmitted forward due to its high straightness if an obstacle is located in front of it.

As shown in FIG. 7 (*a*), when the sound of the tweeter 161 is outputted vertically toward the front, some of it may spread laterally, but most of the sound is reflected on the rear surface of the display module 150, thereby causing a problem in that the sound arriving at the user is weakened.

As shown in FIG. 7 (*b*), since the sound outputted from the tweeter 161 is outputted outward, it may be transmitted forward through the open space in the left and right directions of the display module 150. And, the sound may diffract from the left and right ends of the display module 150, thereby providing a sound of sufficient output to the user located in front of the display module 150.

In this way, the direction of the speaker may be provided obliquely to give the directivity of the sound outputted from the tweeter 161. Yet, in this case, there is a problem that the size of the audio output unit 160 increases to raise the thickness of the second case 102.

Accordingly, the audio output unit 160 of the present disclosure may further include a sound guide 168 for guiding the sound of the tweeter 161 to spread toward the left and right ends of the cases 101 and 102.

Figure 8:
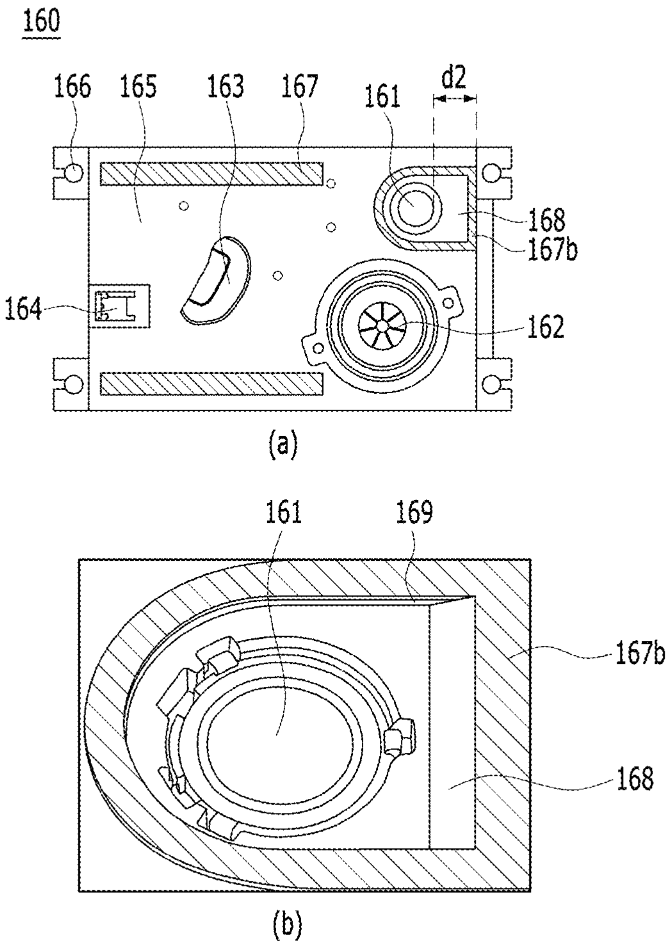
FIG. 8 is a diagram illustrating another embodiment of an audio output unit of a display device according to the present disclosure.

FIG. 8 is a diagram illustrating another embodiment of the audio output unit 160 of the display device 100 according to the present disclosure.

The present embodiment includes a sound guide 168 formed on a second surface of the sound housing 165. The sound guide 168 may be located closer to an outside of the second case 102 than the tweeter 161, and may include an inclined surface protruding more in a front direction toward an end portion.

In order to minimize the output of sound in a central direction of the display module 150, a step difference 169 may be formed at a portion other than a sport where the sound guide 168 is located.

An elastic part 167*b* located on a circumference of the tweeter 161 may be formed along the step difference 169 and the sound guide 168 so as not to overlap the sound guide 168.

Figure 9:
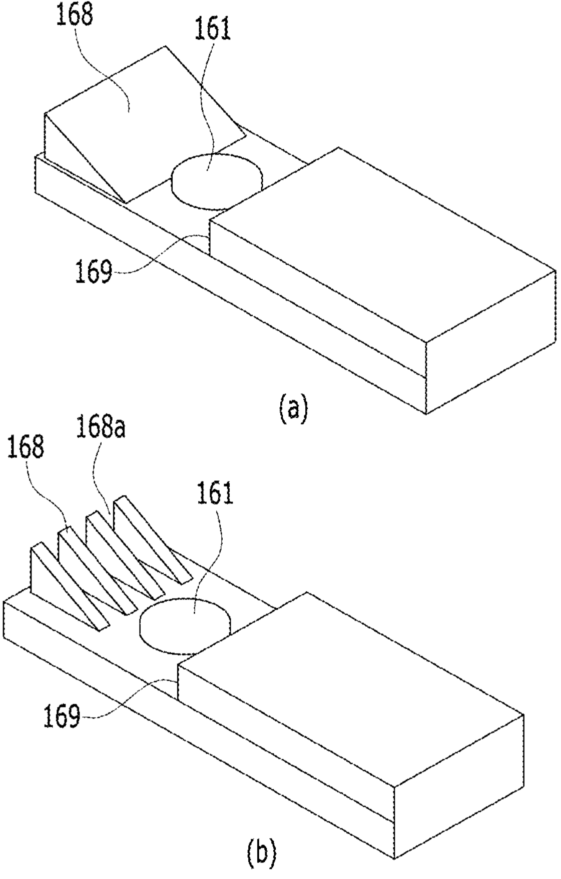
FIG. 9 is a diagram illustrating an example of a sound guide of a display device of the present disclosure.

FIG. 9 is a diagram illustrating an example of the sound guide 168 of the display device 100 of the present disclosure, and an inclined surface in a solid shape is available as shown in FIG. 9 (*a*). As a slit 168*a* is formed like FIG. 9 (*b*), an inclined surface in a laterally open shape may be used.

Figure 10:
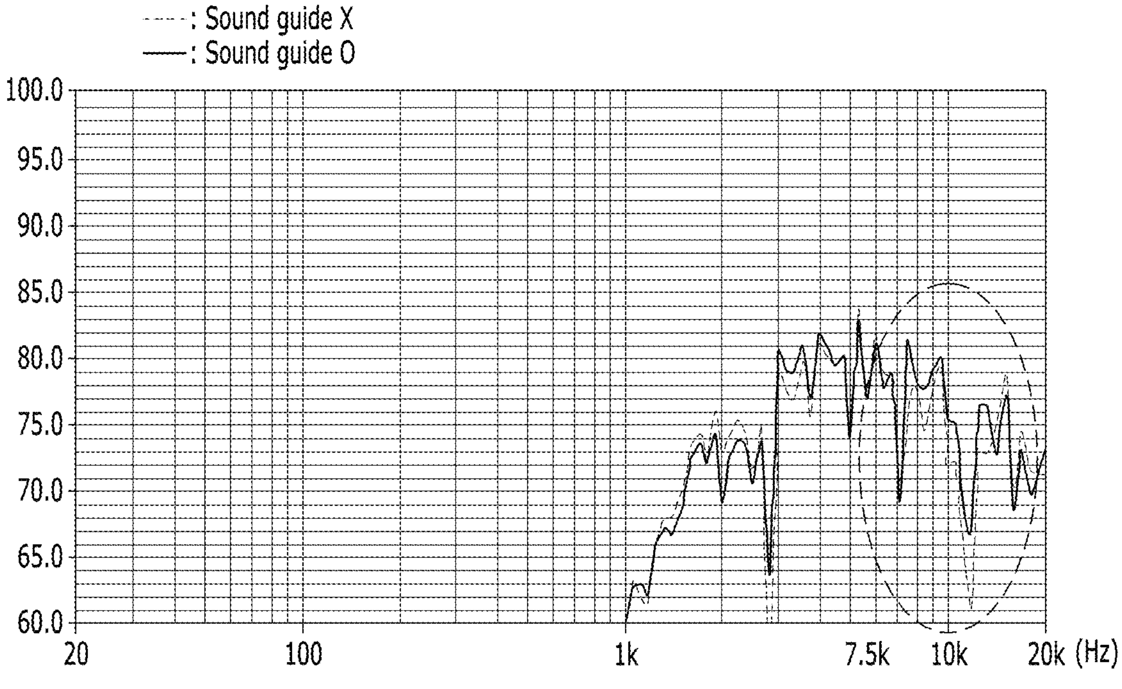
FIG. 10 is a graph illustrating a magnitude of a sound outputted from an audio output unit of a display device of the present disclosure to arrive at a user.

FIG. 10 is a graph showing the intensity at which sound outputted from the tweeter 161 of the display device 100 of the present disclosure arrives at a user, and shows the rate of the intensity of sound sensed by the user over the outputted intensity for each frequency.

The tweeter 161 outputs sound in a frequency band of 1 kHz or more. If the sound guide 168 exists around the tweeter 161, it can be seen that performance is improved in a high-pitched frequency band of 7.5 kHz or more.

According to the present disclosure, the display device 100 may be conveniently carried without having to carry a separate stand or speaker.

In addition, the display device 100 of the present disclosure may sufficiently transmit sound in a high frequency band to a user located in front of the display device 100 through the sound guide 168.

The above detailed description should not be construed as being limitative in all terms, but should be considered as being illustrative. The scope of the present disclosure should be determined by reasonable analysis of the accompanying claims, and all changes in the equivalent range of the present disclosure are included in the scope of the present disclosure.

What is claimed is:

1. A display device, comprising;

a case having a first case, and a second case hinge-coupled together by forming an inner space;

a display module located inside the case;

a link located between the first case and a rear surface of the display module to vary a position of the display module by changing an angle; and an audio output unit located in the second case, the audio output unit comprising:

a sound housing having a first surface coupled to the second case;

a speaker located on a second surface of the sound housing and outputting sound in a front direction perpendicular to the second surface of the sound housing; and a sound guide formed on the second surface of the sound housing and positioned closer to an end portion of the second case than the speaker wherein the sound guide has an inclined surface protruding further in the front direction, toward the end portion of the second case from the speaker to spread sound from the speaker to the end of the second case.

2. The display device of claim 1, wherein the audio output unit is formed symmetrically on both sides of the second case in a horizontal direction and wherein the speaker is disposed adjacent to a horizontal end portion of the second case.

3. The display device of claim 1, wherein the sound guide further comprises a plurality of slits.

4. The display device of claim 1, wherein the speaker outputs sound of 1 kHz or more.

5. The display device of claim 1, further comprising an elastic part attached to the second surface of the sound housing, wherein the elastic part is not located between the speaker and the sound guide.

6. The display device of claim 1, wherein the second surface of the sound housing has a step difference formed on a circumference of the speaker except an area having the sound guide located therein.

7. The display device of claim 1, the audio output unit comprising:

a resonance space formed inside the sound housing; and a resonance hole formed in one side of the sound housing.

8. The display device of claim 1, wherein the second case is erected on one side of the first case in a direction vertical to the first case to fix an open state, wherein the display module is located in a direction of an other side rather than the second case when erected on the first case in the vertical direction, and wherein the speaker faces a rear surface of the display module.

9. The display device of claim 1, wherein the case comprises a handle formed on one side thereof.

10. The display device of claim 1, comprising a plurality of legs accommodated in the second or first case, wherein the first case further comprises a leg fastening part on an outside thereof to be coupled to an end portion of the leg.

* * * * *